US012696795B2

(12) United States Patent
Hironaka et al.

(10) Patent No.: US 12,696,795 B2
(45) Date of Patent: Jul. 28, 2026

(54) SEMICONDUCTOR DEVICE, POWER CONVERTER, AND MOVING VEHICLE

(71) Applicant: Mitsubishi Electric Corporation, Tokyo (JP)

(72) Inventors: Yoichi Hironaka, Tokyo (JP); Tatsunori Yanagimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 654 days.

(21) Appl. No.: 18/003,867

(22) PCT Filed: Sep. 2, 2020

(86) PCT No.: PCT/JP2020/033217
§ 371 (c)(1),
(2) Date: Dec. 29, 2022

(87) PCT Pub. No.: WO2022/049660
PCT Pub. Date: Mar. 10, 2022

(65) Prior Publication Data
US 2023/0268239 A1    Aug. 24, 2023

(51) Int. Cl.
*H10W 76/136* (2026.01)
*H10W 40/25* (2026.01)
(Continued)

(52) U.S. Cl.
CPC ....... *H10W 76/136* (2026.01); *H10W 40/255* (2026.01); *H10W 74/016* (2026.01);
(Continued)

(58) Field of Classification Search
CPC ............... H01L 23/049; H01L 21/4807; H01L 21/4817; H01L 21/565; H01L 23/3142;
(Continued)

(56) References Cited

U.S. PATENT DOCUMENTS

2009/0213553 A1*  8/2009  Tschirbs .............. H01L 23/3735
                                                                    361/728
2018/0076053 A1    3/2018  Karasawa
(Continued)

FOREIGN PATENT DOCUMENTS

CN        107818955 A      3/2018
CN        109659284 A      4/2019
(Continued)

OTHER PUBLICATIONS

An Office Action; mailed by the China National Intellectual Property Administration of the People's Republic of China on Mar. 28, 2025, which corresponds to Chinese Patent Application No. 202080103496.9 and is related to U.S. Appl. No. 18/003,867.
(Continued)

*Primary Examiner* — Jeff W Natalini
*Assistant Examiner* — Nicholas Leland Hutson
(74) *Attorney, Agent, or Firm* — Studebaker Brackett PLLC

(57) ABSTRACT

The present disclosure has been conceived to solve such a problem, and it is an object of the present disclosure to provide a semiconductor device enabling reduction in cost. A semiconductor device according to the present disclosure includes: a base plate; an insulating substrate disposed over the base plate; a semiconductor chip disposed over the insulating substrate; a first resin case and a second resin case attached to the base plate to enclose the insulating substrate and the semiconductor chip, and fitted together; and a sealing material to seal the insulating substrate and the semiconductor chip, wherein the first resin case and the second resin case are formed of resin materials having different comparative tracking indices.

17 Claims, 10 Drawing Sheets

(51) Int. Cl.

| | |
|---|---|
| *H10W 74/01* | (2026.01) |
| *H10W 74/10* | (2026.01) |
| *H10W 76/01* | (2026.01) |
| *H10W 99/00* | (2026.01) |
| *B61C 17/00* | (2006.01) |
| *H02P 27/08* | (2006.01) |

(52) U.S. Cl.

CPC ......... *H10W 74/127* (2026.01); *H10W 76/01* (2026.01); *H10W 99/00* (2026.01); *B61C 17/00* (2013.01); *H02P 27/08* (2013.01)

(58) Field of Classification Search

CPC ..... H01L 23/3735; H01L 23/06; H01L 23/10; H01L 23/24; H01L 23/16; H01L 24/49; H01L 2224/32225; H01L 2224/48091; H01L 2224/48227; H01L 2224/4846; H01L 2224/73265; H01L 2924/181; B61C 17/00; H02P 27/08

See application file for complete search history.

(56) References Cited

U.S. PATENT DOCUMENTS

| | | | |
|---|---|---|---|
| 2019/0109059 A1 | 4/2019 | Ohara et al. | |
| 2020/0126947 A1* | 4/2020 | Karasawa | H01L 25/162 |
| 2020/0402880 A1* | 12/2020 | Yamauchi | H01L 23/3142 |
| 2021/0398880 A1* | 12/2021 | Kanai | H01L 21/565 |
| 2022/0230945 A1* | 7/2022 | Sato | H10W 76/157 |

FOREIGN PATENT DOCUMENTS

| | | |
|---|---|---|
| JP | 2001-177053 A | 6/2001 |
| JP | 2003-068979 A | 3/2003 |
| JP | 2005-243713 A | 9/2005 |
| JP | 2012-129344 A | 7/2012 |
| JP | 2018-046158 A | 3/2018 |
| JP | 2019-071392 A | 5/2019 |
| JP | 2019-147943 A | 9/2019 |

OTHER PUBLICATIONS

International Search Report issued in PCT/JP2020/033217; mailed Nov. 24, 2020.

An Office Action; "Notice of Reasons for Refusal," mailed by the Japanese Patent Office on Feb. 7, 2023, which corresponds to Japanese Patent Application No. 2022-546769 and is related to U.S. Appl. No. 18/003,867; with English language translation.

An Office Action; "Notice of Reasons for Refusal," mailed by the Japanese Patent Office on Jul. 11, 2023, which corresponds to Japanese Patent Application No. 2022-546769 and is related to U.S. Appl. No. 18/003,867; with English language translation.

* cited by examiner

F I G.   1
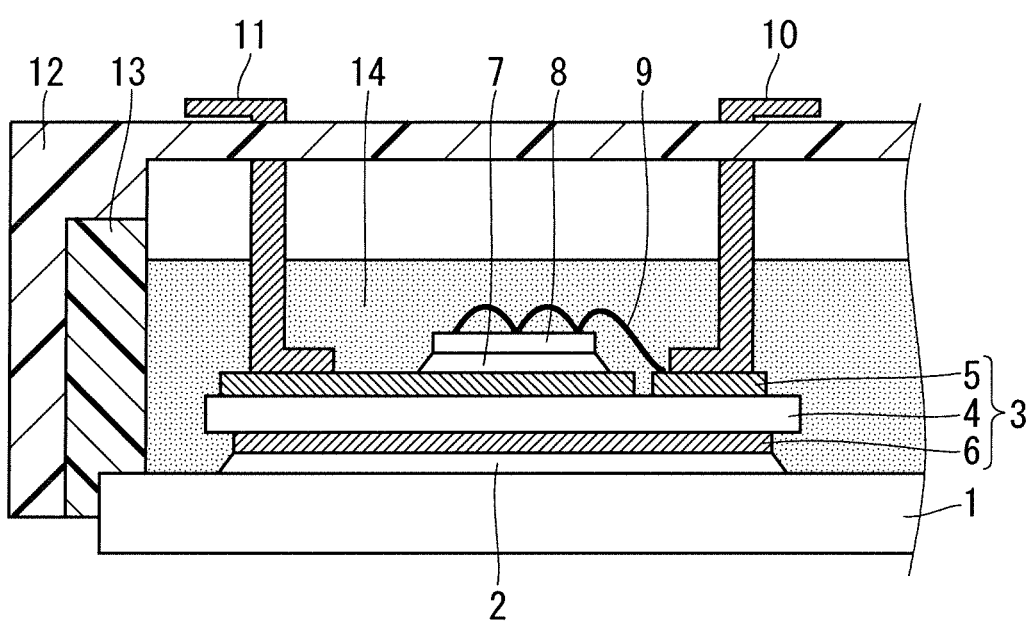

F I G.  2
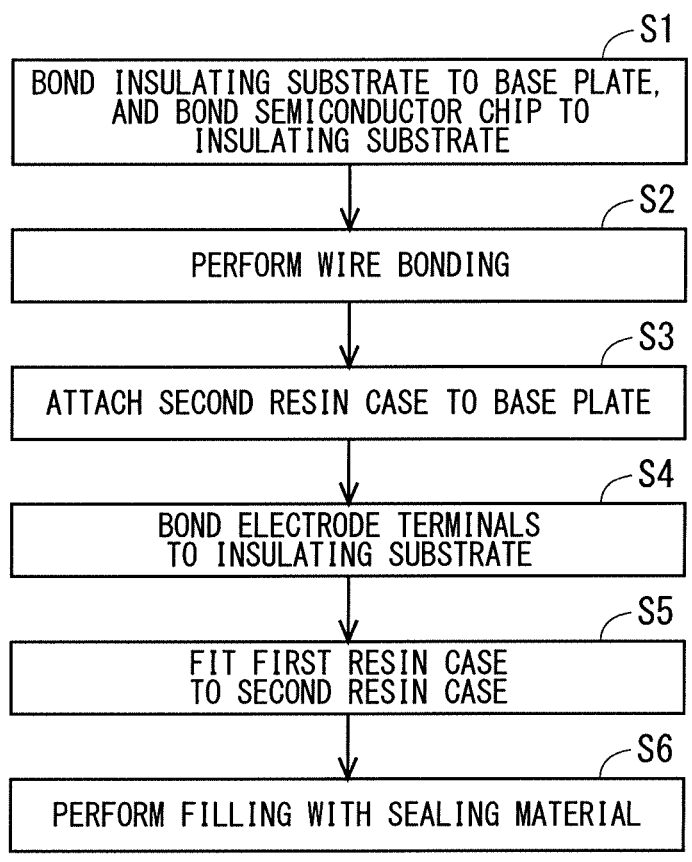
S1
BOND INSULATING SUBSTRATE TO BASE PLATE, AND BOND SEMICONDUCTOR CHIP TO INSULATING SUBSTRATE
S2
PERFORM WIRE BONDING
S3
ATTACH SECOND RESIN CASE TO BASE PLATE
S4
BOND ELECTRODE TERMINALS TO INSULATING SUBSTRATE
S5
FIT FIRST RESIN CASE TO SECOND RESIN CASE
S6
PERFORM FILLING WITH SEALING MATERIAL F I G. 3
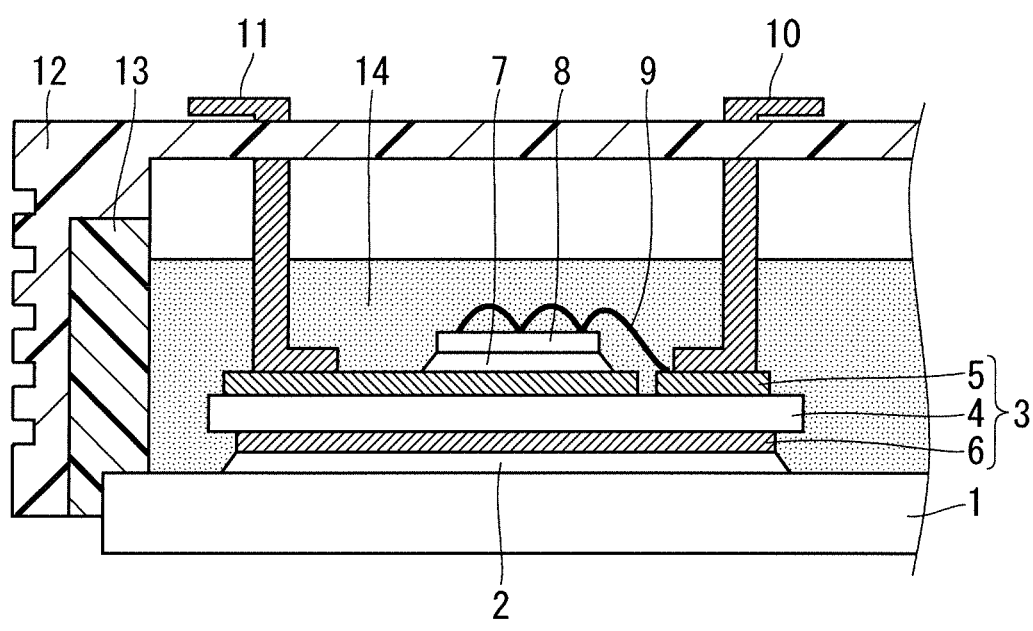

F I G.  4
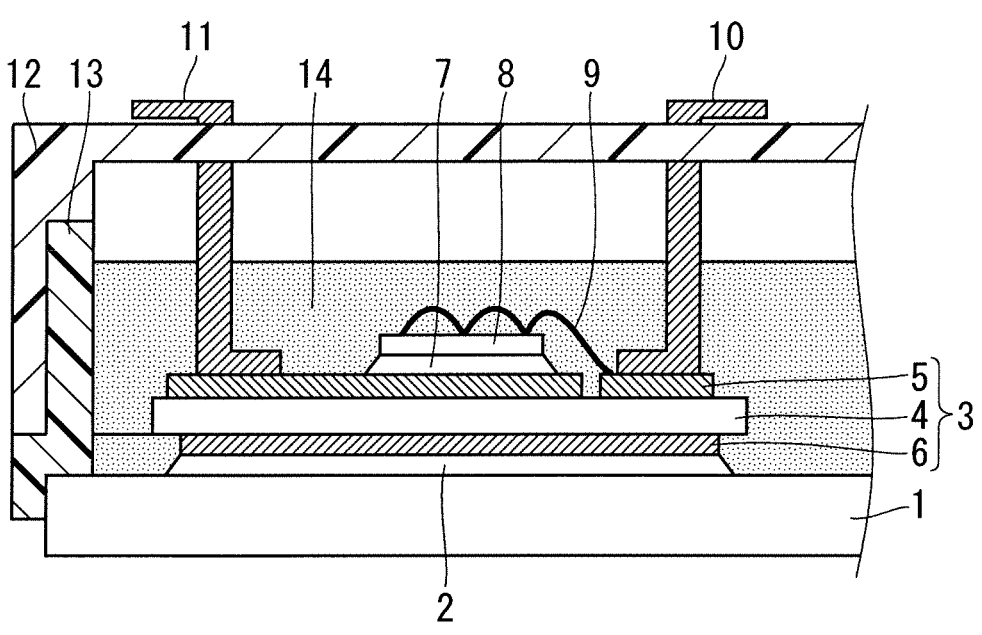

F I G.  5
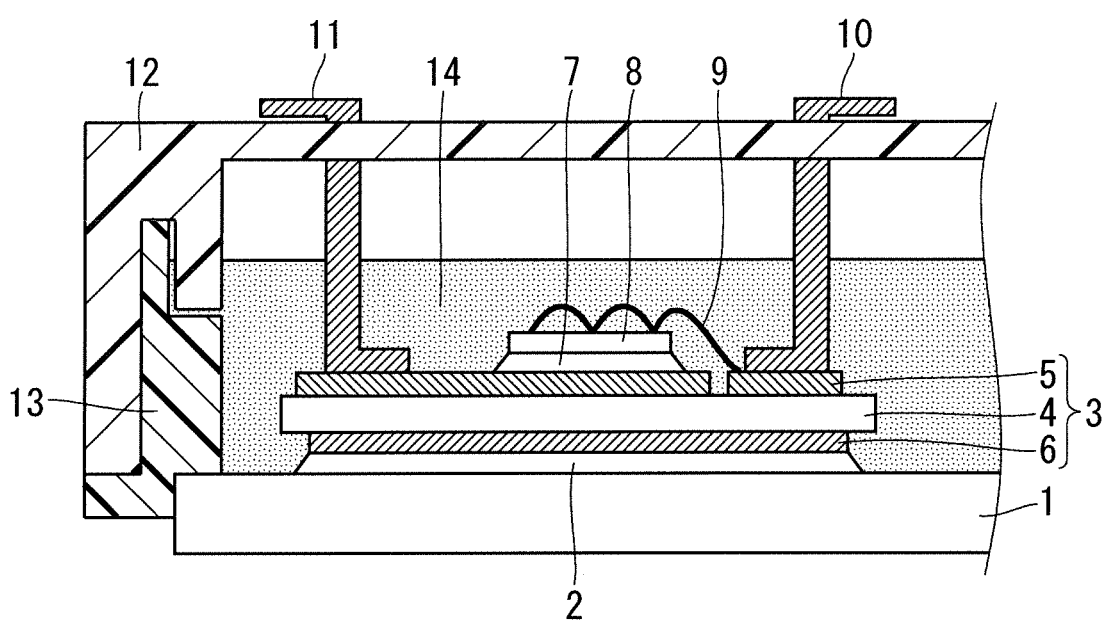

F I G. 6
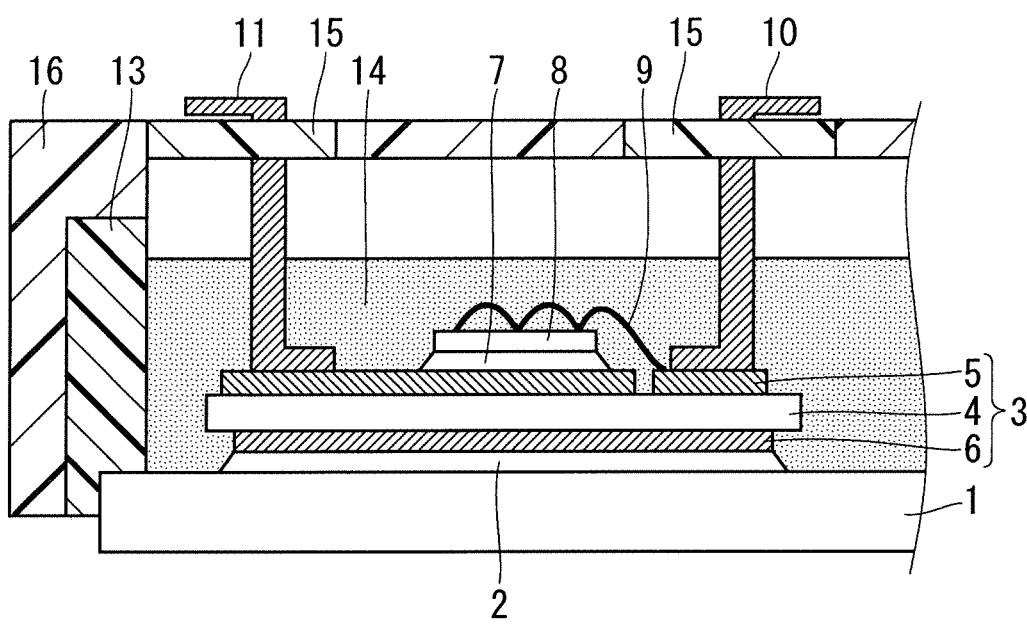

F I G. 7
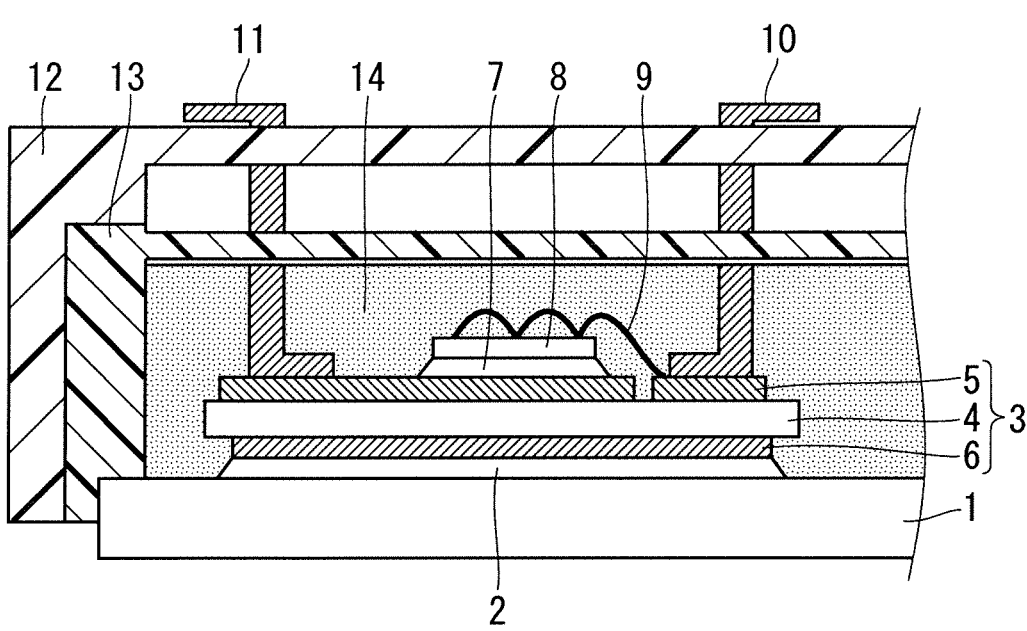

F I G. 8
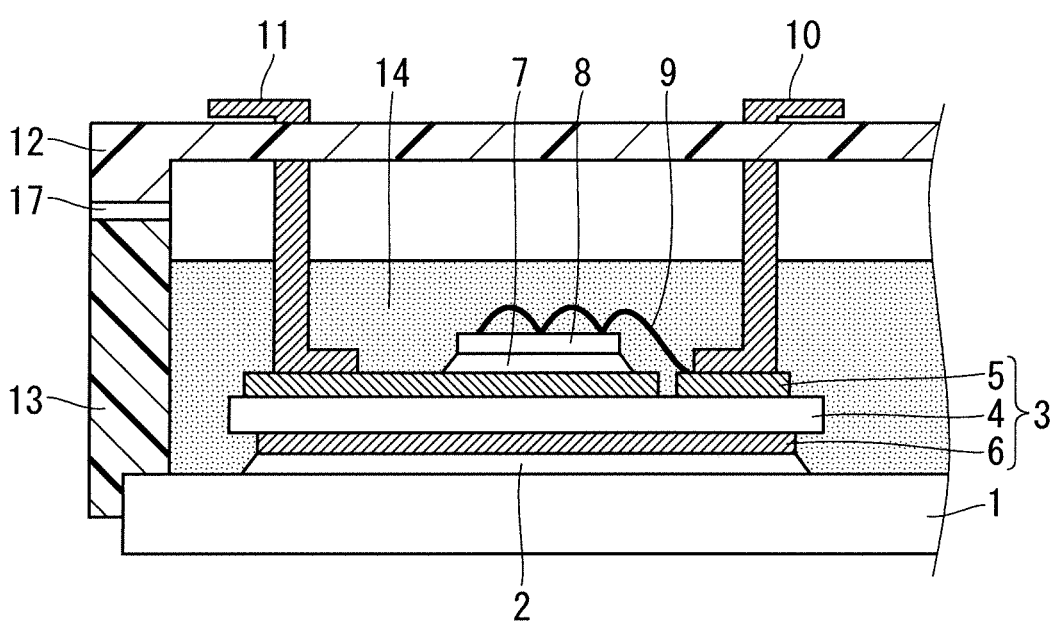

F I G. 9
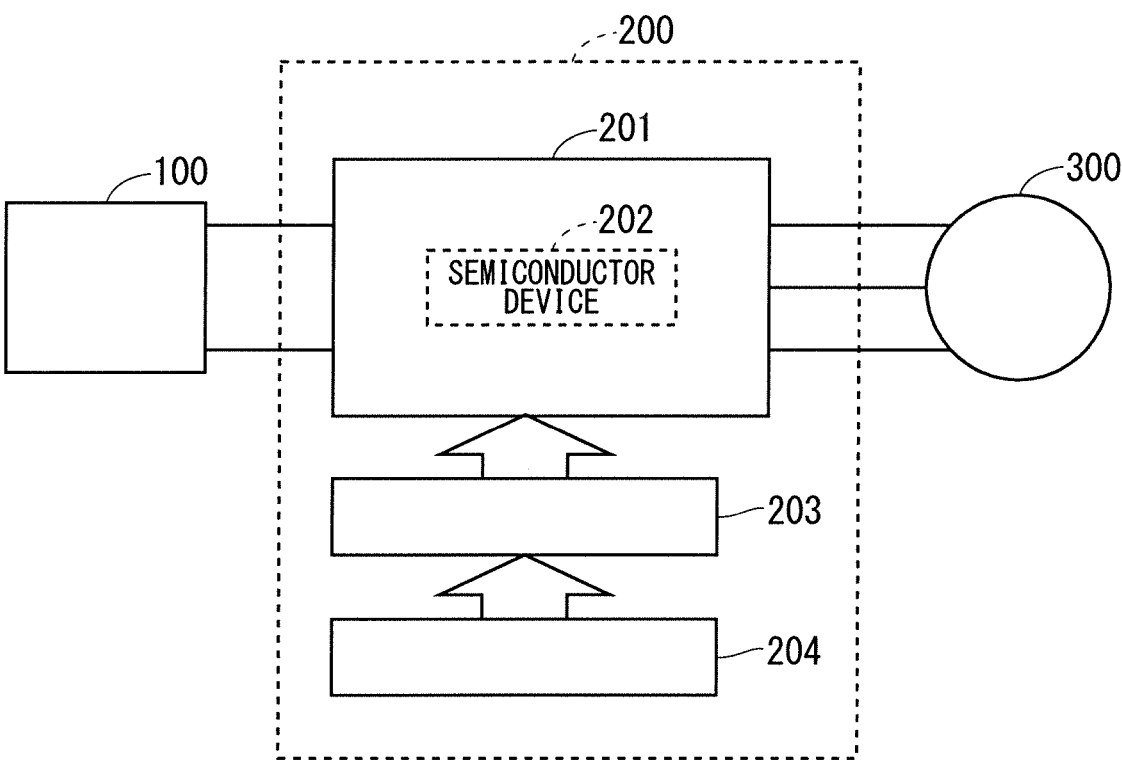

F I G. 1 0
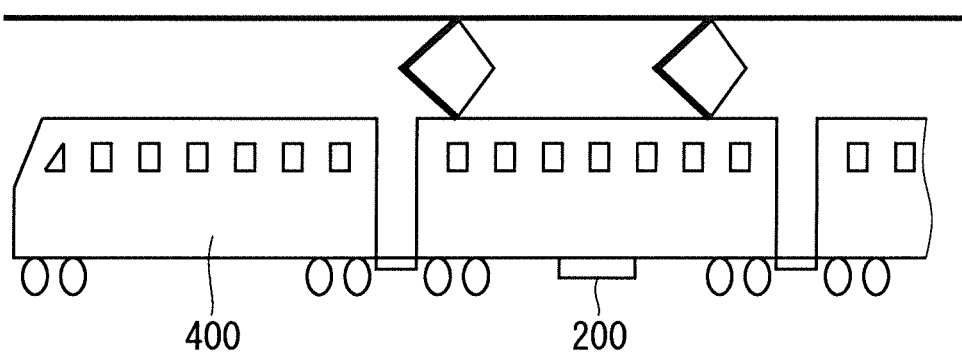

SEMICONDUCTOR DEVICE, POWER CONVERTER, AND MOVING VEHICLE

TECHNICAL FIELD

The present disclosure relates to a semiconductor device, a power converter to which the semiconductor device is applied, and a moving vehicle to which the power converter is applied.

BACKGROUND ART

With recent progress of practical implementations of a wide bandgap semiconductor, such as silicon carbide (SiC), a demand for a higher heat resistance of a power semiconductor device increases. On the other hand, a power semiconductor device used in a harsh environment often requires, for a part where insulation on a surface of the power semiconductor device is secured, a material having a high comparative tracking index (CTI) based on a standard required in JIS C 60664-1 (IEC60664-1), for example. It is therefore important for a resin material used for a housing case to form the power semiconductor device to have both a high heat resistance and a high comparative tracking index while having mechanical properties, such as mechanical strength, to protect the interior of the power semiconductor device.

A power semiconductor formed by a molded product of polyphenylenesulfide (PPS) resin having a high heat resistance, a high mechanical strength, and an excellent tracking resistance has been proposed (see Patent Document 1, for example).

PRIOR ART DOCUMENTS

Patent Document

Patent Document 1: Japanese Patent Application Laid-Open No. 2019-147943

SUMMARY

Problem to be Solved by the Invention

While it is typically necessary to increase a glass transition temperature (Tg) of a resin material to increase heat resistance of the resin material, tracking resistance decreases with increasing glass transition temperature. That is to say, there is a trade-off between the glass transition temperature and the tracking resistance. For example, when the number of crosslink points is increased using crosslinking units of an aromatic system to increase the glass transition temperature, aromatic rings increase to facilitate carbonization and reduce tracking resistance.

Addition of magnesium hydroxide, another polymer, and an additive to resin to improve cracking resistance is also contemplated. However, it is also known that a high magnesium hydroxide content is required to obtain an excellent cracking resistance, suffering from the disadvantage of significantly reducing mechanical strength and other properties of resin composition, for example.

For these reasons, it is technically difficult to develop a resin material having both a high heat resistance and a high comparative tracking index without impairing original mechanical properties of resin, and a corresponding material is expensive and has an extremely limited option. Selection of the limited resin material (a resin material used for the housing case) based on a market demand thus contributes to an increase in cost of a semiconductor device.

The present disclosure has been conceived to solve such a problem, and it is an object of the present disclosure to provide a semiconductor device enabling reduction in cost.

Means to Solve the Problem

To solve the above-mentioned problem, a semiconductor device according to the present disclosure includes: a base plate; an insulating substrate disposed over the base plate; a semiconductor chip disposed over the insulating substrate; a first resin case and a second resin case attached to the base plate to enclose the insulating substrate and the semiconductor chip, and fitted together; and a sealing material to seal the insulating substrate and the semiconductor chip, wherein the first resin case and the second resin case are formed of resin materials having different comparative tracking indices.

Effects of the Invention

According to the present disclosure, the semiconductor device includes the first resin case and the second resin case formed of the resin materials having different comparative tracking indices, so that a cost can be reduced.

The objects, features, aspects and advantages of the present disclosure will become more apparent from the following detailed description and the accompanying drawings.

BRIEF DESCRIPTION OF DRAWINGS

FIG. 1 is a cross-sectional view illustrating one example of a configuration of a semiconductor device according to Embodiment 1.

FIG. 2 is a flowchart showing one example of a process of manufacturing the semiconductor device according to Embodiment 1.

FIG. 3 is a cross-sectional view illustrating one example of the configuration of the semiconductor device according to Embodiment 1.

FIG. 4 is a cross-sectional view illustrating one example of the configuration of the semiconductor device according to Embodiment 1.

FIG. 5 is a cross-sectional view illustrating one example of a configuration of a semiconductor device according to Embodiment 2.

FIG. 6 is a cross-sectional view illustrating one example of a configuration of a semiconductor device according to Embodiment 3.

FIG. 7 is a cross-sectional view illustrating one example of a configuration of a semiconductor device according to Embodiment 4.

FIG. 8 is a cross-sectional view illustrating one example of a configuration of a semiconductor device according to Embodiment 5.

FIG. 9 is a diagram showing one example of a configuration of a power converter to which the semiconductor devices according to Embodiments 1 to 5 are applied.

FIG. 10 is a diagram illustrating one example of a moving vehicle to which the power converter according to Embodiment 6 is applied.

DESCRIPTION OF EMBODIMENTS

Embodiment 1

<Configuration>

FIG. 1 is a cross-sectional view illustrating one example of a configuration of a semiconductor device according to Embodiment 1.

As illustrated in FIG. 1, an insulating substrate 3 is disposed over a base plate 1. The base plate 1 is formed of metal having good heat conductivity, such as copper (Cu), aluminum (Al), an aluminum alloy, AlSiC, and MgSiC.

The insulating substrate 3 includes a ceramic substrate 4, a top surface electrode pattern 5 formed on a top surface (a surface on a top side of illustration) of the ceramic substrate 4, and a bottom surface electrode pattern 6 formed on a bottom surface (a surface on a bottom side of illustration) of the ceramic substrate 4. The ceramic substrate 4 is formed of aluminum nitride, silicon nitride, aluminum oxide, and the like. The top surface electrode pattern 5 and the bottom surface electrode pattern 6 are formed of copper or aluminum, for example.

The base plate 1 and the bottom surface electrode pattern 6 of the insulating substrate 3 are bonded by a bonding material 2. The bonding material 2 is formed of solder, a brazing material, sintered silver, a liquid phase diffusion material, and the like.

A semiconductor chip 8 and electrode terminals 10 and 11 are arranged over the top surface electrode pattern 5 of the insulating substrate 3. The semiconductor chip 8 is electrically connected to the top surface electrode pattern 5 via a bonding material 7. The semiconductor chip 8 is formed of an insulated gate bipolar transistor (IGBT), a diode, a metal oxide semiconductor field effect transistor (MOSFET), a reverse conducting IGBT (RC-IGBT), and the like. The bonding material 7 is formed of solder, a brazing material, sintered silver, a liquid phase diffusion material, and the like.

The electrode terminals 10 and 11 are electrically connected to the top surface electrode pattern 5. The electrode terminals 10 and 11 are formed of copper or aluminum, for example.

The semiconductor chip 8 and the top surface electrode pattern 5 are electrically connected by a metal wire 9. The metal wire 9 is formed of aluminum, an aluminum alloy, copper, a copper alloy, and the like.

A first resin case 12 and a second resin case 13 are attached to the base plate 1 to enclose the insulating substrate 3 and the semiconductor chip 8, and are fitted together. Specifically, the second resin case 13 is provided to an end of the base plate 1 to form a portion of a side wall of the semiconductor device. The first resin case 12 is disposed to cover at least a side surface and a top surface of the second resin case 13 and cover the interior of the semiconductor device as a whole. The electrode terminals 10 and 11 are secured to the first resin case 12, and ends of the electrode terminals 10 and 11 are externally exposed from the first resin case 12.

The first resin case 12 and the second resin case 13 are formed of different resin materials, and are formed of resin materials, such as polyphenylenesulfide (PPS), polyphthalamide (PPA), liquid crystal polymer (LCP), polyethersulfone (PES), polyamide (PA), polyethylene terephthalate (PET), and polybutylene terephthalate (PBT).

The first resin case 12 has a higher comparative tracking index than the second resin case 13. The comparative tracking index (CTI) of each of the first resin case 12 and the second resin case 13 is 100 or more, and preferably satisfies an inequality $400 \leq CTI < 600$ and more preferably satisfies an inequality $600 \leq CTI$.

A glass transition temperature (Tg) of each of the first resin case 12 and the second resin case 13 is 100° C. or more, and preferably satisfies an inequality $150° C. \leq Tg$ and more preferably satisfies an inequality $175° C. \leq Tg$.

A creepage distance and clearance required for surface insulation of the semiconductor device are satisfied only by the first resin case 12. The first resin case 12 and the second resin case 13 may be adhered with an adhesive, may be bonded in a snap-fit, or may be formed by two-color molding.

A sealing material 14 seals the semiconductor chip 8, the insulating substrate 3, and the metal wire 9 in the interior of the semiconductor device surrounded by the first resin case 12, the second resin case 13, and the base plate 1. The sealing material 14 is formed of an insulating material, such as a silicone gel and epoxy resin.

<Manufacturing Method>

FIG. 2 is a flowchart showing one example of a process of manufacturing the semiconductor device according to Embodiment 1.

In step S1, the insulating substrate 3 is bonded to the base plate 1 by the bonding material 2. The semiconductor chip 8 is bonded to the insulating substrate 3 by the bonding material 7.

In step S2, the semiconductor chip 8 and the top surface electrode pattern 5 of the insulating substrate 3 are wire bonded by the metal wire 9.

In step S3, the second resin case 13 is attached to the end of the base plate 1.

In step S4, the electrode terminals 10 and 11 are bonded to the top surface electrode pattern 5 of the insulating substrate 3.

In step S5, the first resin case 12 is fitted to the second resin case 13.

In step S6, the interior of the semiconductor device surrounded by the first resin case 12, the second resin case 13, and the base plate 1 is filled with the sealing material 14 to seal the semiconductor chip 8, the insulating substrate 3, and the metal wire 9.

<Effects>

A semiconductor device used in a harsh environment, for example, for photovoltaic generation, wind power generation, and railroad applications is required to satisfy, at a part where insulation on a surface of the semiconductor device is required to be secured, a minimum creepage distance and minimum clearance to be observed determined by comparative tracking indices of materials, a voltage RMS to be used, and a degree of contamination in a usage environment based on a standard required in JIS C 60664-1 (IEC60664-1), for example.

In Embodiment 1, a costly resin material having both a high comparative tracking index and a high heat resistance is used for only a minimum necessary part (the first resin case 12) to secure the creepage distance and the clearance, so that an inexpensive resin material can be selected for the second resin case 13 as the material can be selected regardless of a numerical value of the comparative tracking index. A cost of materials for the semiconductor device can thereby be reduced.

A configuration in which the first resin case 12 and the second resin case 13 are bonded in a snap-fit eliminates the need to adhere the first resin case 12 and the second resin case 13 with an adhesive and the like. This can improve manufacturing throughput of the semiconductor device and the cases.

Formation of the first resin case 12 and the second resin case 13 by two-color molding eliminates the need for a process of assembling the first resin case 12 and the second resin case 13. This can improve manufacturing throughput of the semiconductor device and the cases, and leads to further reduction in cost of materials.

The material for the second resin case 13 can be selected regardless of the numerical value of the comparative tracking index, so that a material that can further improve functions such as heat resistance, adhesion to another material, and mechanical strength can be selected. This can further increase flexibility of case design and reliability of the semiconductor device.

A change of only a structure of the first resin case 12 while using the same member as the second resin case 13 allows for a flexible response even in a case where a required insulating breakdown voltage varies. For example, as illustrated in FIG. 3, the creepage distance can be increased by forming irregularities in a side surface of the first resin case 12. As described above, reduction and standardization of a design man-hour of the semiconductor device allows for reduction in cost of the semiconductor device.

Shapes of the first resin case 12 and the second resin case 13 are not limited to those illustrated in FIGS. 1 and 3. For example, the first resin case 12 and the second resin case 13 may be shaped so that the first resin case 12 covers the second resin case 13 as illustrated in FIGS. 1 and 3, may be shaped so that the first resin case 12 and the second resin case 13 are fitted together as separate top and bottom parts as illustrated in FIG. 4, or may have the other shapes.

Embodiment 2

<Configuration>

FIG. 5 is a cross-sectional view illustrating one example of a configuration of a semiconductor device according to Embodiment 2. As illustrated in FIG. 5, the semiconductor device according to Embodiment 2 is characterized in that the first resin case 12 and the second resin case 13 are fitted by a recess and protrusion structure. The other configuration is similar to the configuration of the semiconductor device described in Embodiment 1, so that detailed description thereof is omitted herein.

The first resin case 12 has a recess, the second resin case 13 has a protrusion, and the first resin case 12 is fitted to the second resin case 13 to cover the second resin case 13. A configuration in which the first resin case 12 has a protrusion and the second resin case 13 has a recess may be used.

The sealing material 14 is loaded to a height of a portion where the first resin case 12 and the second resin case 13 are fitted together, and fills a portion of a gap between the recess and the protrusion fitted together. The first resin case 12 and the second resin case 13 are thereby adhered to each other with the sealing material 14. The sealing material 14 may fill the entire gap between the recess and the protrusion.

<Effects>

It is typically necessary to adhere resin cases to each other with an adhesive to bond the resin cases to each other. According to Embodiment 2, however, the first resin case 12 and the second resin case 13 can be adhered to each other without adding a new process (an adhering process with an adhesive) to allow for reduction in processing required for adhesion and in cost of materials.

Embodiment 3

<Configuration>

FIG. 6 is a cross-sectional view illustrating one example of a configuration of a semiconductor device according to Embodiment 3. As illustrated in FIG. 6, the semiconductor device according to Embodiment 3 is characterized in that the first resin case includes a first resin case 15 (a predetermined first part including positions where the electrode terminals 10 and 11 are secured) corresponding to a part around the electrode terminals 10 and 11 and a first resin case 16 (a second part) corresponding to the other part, and the first resin case 15 and the first resin case 16 are formed of different resin materials. The other configuration is similar to that in Embodiment 1, so that detailed description thereof is omitted herein.

In the first resin case 12, the first resin case 15 has a higher glass transition temperature (Tg) than the first resin case 16. The creepage distance and the clearance required for surface insulation of the semiconductor device are satisfied only by the first resin case 16.

The first resin case 15 and the first resin case 16 may be formed by two-color molding of different resin materials. The first resin case 16 and the second resin case 13 may be formed by two-color molding of different resin materials. One or both of these two types of two-color molding may be performed.

While a case where the first resin case includes the first resin case 15 and the first resin case 16 has been described above, the configuration is not limited to this configuration. A configuration in which the second resin case 13 includes a part around the electrode terminals 10 and 11 and the other part (a second part) may be used.

<Effects>

Use of resin having a high heat resistance for only the part around the electrode terminals 10 and 11 required to have a high heat resistance can further reduce a cost of materials for the semiconductor device. Use of two-color molding can improve manufacturing throughput of the semiconductor device and the cases.

Selection of a high toughness, high strength resin material for the part around the electrode terminals 10 and 11 can improve resistance to bending of the electrode terminals 10 and 11 and stress caused when a bus bar is attached to the electrode terminals 10 and 11 to reduce the risk of breakage of the cases. Manufacturing throughput of the semiconductor device and the cases can also be improved.

Embodiment 4

<Configuration>

FIG. 7 is a cross-sectional view illustrating one example of a configuration of a semiconductor device according to Embodiment 4. As illustrated in FIG. 7, the semiconductor device according to Embodiment 4 is characterized in that the electrode terminals 10 and 11 are secured to the second resin case 13 by insert molding. The other configuration is similar to that in Embodiment 1, so that detailed description thereof is omitted herein.

While the electrode terminals 10 and 11 are secured to the second resin case 13 by insert molding in the example of FIG. 7, the configuration is not limited to this configuration. For example, the electrode terminals 10 and 11 may be secured to the first resin case 12 by insert molding.

The semiconductor chip 8 is formed of a wide bandgap semiconductor, such as SiC and GaN. The semiconductor chip 8 may be a combination of any of the IGBT, the MOSFET, the diode, and the like.

The electrode terminals 10 and 11 are ultrasonically bonded (ultrasonically welded) to the top surface electrode pattern 5 of the insulating substrate 3.

<Effects>

By insert molding the electrode terminals 10 and 11 into the second resin case 13, the electrode terminals 10 and 11 and the insulating substrate 3 can be secured in advance. Variation in positions can thereby be reduced compared with a case where the electrode terminals 10 and 11 and the insulating substrate 3 are combined separately.

It is important to precisely align the electrode terminals 10 and 11 and the insulating substrate 3 when ultrasonic bonding (ultrasonic welding) is used as a method for bonding the electrode terminals 10 and 11 and the insulating substrate 3, and a positioning process using a securing jig is required when the electrode terminals 10 and 11 and the insulating substrate 3 are combined separately. According to Embodiment 4, positions of the electrode terminals 10 and 11 can be secured by the second resin case 13 during a process of manufacturing the semiconductor device, and positioning using the jig is not required. Ultrasonic bonding can thereby be used without adding a man-hour in the process of manufacturing the semiconductor device.

While solder bonding has mainly been used as the method for bonding the electrode terminals and the insulating substrate, ultrasonic bonding has many advantages as shown in (A) to (D) below compared with solder bonding.

(A) A low-melting point material such as solder is not used, so that portions where the electrode terminals and the insulating substrate are bonded can have a high heat resistance.

(B) Ultrasonic bonding is solid phase diffusion bonding of metals, so that bonding strength is high, and reliability and quality of the bonding portions can be improved.

(C) With improvement in reliability of the bonding portions, the area required for bonding can be reduced. This improves flexibility of design of the semiconductor device.

(D) In solder bonding, a cleaning process after bonding is required to remove flux residues. On the other hand, in ultrasonic bonding, cleaning of the bonding portions is not required, and manufacturing throughput of the semiconductor device is improved.

Use of a wide bandgap semiconductor chip that releases high heat as the semiconductor chip 8 allows for a high current and high-temperature operation of the semiconductor device to contribute to energy saving of the semiconductor device. Use of the first resin case 12 and the second resin case 13 having a high heat resistance satisfying an inequality Tg≥100° C. (more preferably 175° C.) and use of ultrasonic bonding to bond the electrode terminals 10 and 11 and the insulating substrate 3 improve heat resistance of the semiconductor device, and allow for a higher current, high-temperature operation, and energy saving of the semiconductor device.

Embodiment 5

<Configuration>

FIG. 8 is a cross-sectional view illustrating one example of a configuration of a semiconductor device according to Embodiment 5. As illustrated in FIG. 8, the semiconductor device according to Embodiment 5 is characterized in that the first resin case 12 and the second resin case 13 are secured with an insulating adhesive. The other configuration is similar to that in Embodiment 1, so that detailed description thereof is omitted herein.

<Effects>

Even with a structure in which the second resin case 13 can be the shortest path of the creepage distance for surface insulation of the semiconductor device in design, insulation can be secured by interposing an insulating material along the path. Flexibility of case design can thereby be further improved.

Embodiment 6

In Embodiment 6, the semiconductor devices according to Embodiments 1 to 5 described above are applied to a power converter. While application of the semiconductor devices according to Embodiments 1 to 5 is not limited to a particular power converter, a case where the semiconductor devices according to Embodiments 1 to are applied to a three-phase inverter will be described below.

FIG. 9 is a block diagram showing a configuration of a power conversion system to which the power converter according to Embodiment 6 is applied.

The power conversion system shown in FIG. 9 includes a power supply 100, a power converter 200, and a load 300. The power supply 100 is a DC power supply, and supplies DC power to the power converter 200. The power supply 100 can be formed by various power supplies, and, for example, may be formed by a DC system, a solar cell, and a storage battery, or may be formed by a rectifier circuit or an AC/DC converter connected to an AC system. The power supply 100 may be formed by a DC/DC converter to convert DC power output from the DC system into predetermined power.

The power converter 200 is a three-phase inverter connected between the power supply 100 and the load 300, and converts the DC power supplied from the power supply 100 into AC power, and supplies the AC power to the load 300. As shown in FIG. 9, the power converter 200 includes a main conversion circuit 201 to convert the DC power into the AC power for output, a drive circuit 203 to output a drive signal to drive each of switching elements of the main conversion circuit 201, and a control circuit 204 to output, to the drive circuit 203, a control signal to control the drive circuit 203. The main conversion circuit 201 includes a semiconductor device 202. The semiconductor device 202 corresponds to the semiconductor devices according to Embodiments 1 to 5.

The load 300 is a three-phase motor driven by the AC power supplied from the power converter 200. The load 300 is not limited to that for a particular application, is a motor mounted on various types of electrical equipment, and is used as a motor for hybrid vehicles, electric vehicles, railroad vehicles, elevators, or air-conditioning equipment, for example.

The power converter 200 will be described in detail below. The main conversion circuit 201 includes the switching elements and freewheeling diodes, and converts the DC power supplied from the power supply 100 into the AC power, and supplies the AC power to the load 300 through switching of the switching elements. While the main conversion circuit 201 can have various specific circuit configurations, the main conversion circuit 201 according to Embodiment 6 is a two-level three-phase full-bridge circuit, and can include six switching elements and six freewheeling diodes connected in anti-parallel with the respective switching elements. The semiconductor device according to any one of Embodiments 1 to 5 described above is applied to each of the switching elements of the main conversion circuit 201. Every two switching elements out of the six switching elements are connected in series with each other to constitute pairs of upper and lower arms, and the pairs of upper and lower arms constitute respective phases (a U phase, a V phase, and a W phase) of the full-bridge circuit. Output terminals of the respective pairs of upper and lower arms, that is, three output terminals of the main conversion circuit 201 are connected to the load 300.

The drive circuit 203 generates the drive signal to drive each of the switching elements of the main conversion circuit 201, and supplies the drive signal to a control electrode of each of the switching elements of the main conversion circuit 201. Specifically, to the control electrode of each of the switching elements, a drive signal to switch the switching element to an on state and a drive signal to switch the switching element to an off state are output in accordance with the control signal from the control circuit 204, which will be described below. The drive signal is a voltage signal (an on signal) equal to or greater than a threshold voltage of the switching element when the switching element is maintained in the on state, and is a voltage signal (an off signal) equal to or smaller than the threshold voltage of the switching element when the switching element is maintained in the off state.

The control circuit 204 controls the switching elements of the main conversion circuit 201 so that desired power is supplied to the load 300. Specifically, time (on time) during which each of the switching elements of the main conversion circuit 201 is to be in the on state is calculated based on power to be supplied to the load 300. For example, the main conversion circuit 201 can be controlled through PWM control to modulate the on time of each of the switching elements in accordance with a voltage to be output. A control command (the control signal) is output to the drive circuit 203 so that the on signal is output to a switching element to be in the on state, and the off signal is output to a switching element to be in the off state at each time point. The drive circuit 203 outputs, as the drive signal, the on signal or the off signal to the control electrode of each of the switching elements in accordance with the control signal.

In the power converter according to Embodiment 6, the semiconductor devices according to Embodiments 1 to 5 are applied as the switching elements of the main conversion circuit 201 to allow for reduction in cost and energy saving of the power converter.

While an example in which the semiconductor devices according to Embodiments 1 to 5 are applied to the two-level three-phase inverter has been described in Embodiment 6, application of the semiconductor devices according to Embodiments 1 to 5 is not limited to this application, and the semiconductor devices according to Embodiments 1 to 5 are applicable to various power converters. While a two-level power converter has been described as one example in Embodiment 6, the power converter may be a three-level or multi-level power converter, and the semiconductor devices according to Embodiments 1 to 5 may be applied to a single-phase inverter when power is supplied to a single-phase load. The semiconductor devices according to Embodiments 1 to 5 are applicable to a DC/DC converter or an AC/DC converter when power is supplied to a DC load and the like.

The power converter to which the semiconductor devices according to Embodiments 1 to 5 are applied is not limited to that in the above-mentioned case where the load is the motor, and can be used as a power supply device of an electrical discharge machine, a laser machine, an induction cooker, or a noncontact power supply system, for example, and can further be used as a power conditioner of a photovoltaic generation system, a storage system, and the like.

Embodiment 7

FIG. 10 is a diagram illustrating one example of a moving vehicle to which the power converter according to Embodiment 6 is applied. As illustrated in FIG. 10, the power converter 200 described in Embodiment 6 is mounted on the moving vehicle 400.

According to Embodiment 7, reduction in cost and energy saving of the moving vehicle can be achieved.

Embodiments can freely be combined with each other, and can be modified or omitted as appropriate within the scope of the present disclosure.

While the present disclosure has been described in detail, the foregoing description is in all aspects illustrative and not restrictive. It is understood that numerous unillustrated modifications can be devised.

EXPLANATION OF REFERENCE SIGNS

1 base plate, 2 bonding material, 3 insulating substrate, 4 ceramic substrate, 5 top surface electrode pattern, 6 bottom surface electrode pattern, 7 bonding material, 8 semiconductor chip, 9 metal wire, 10 electrode terminal, 11 electrode terminal, 12 first resin case, 13 second resin case, 14 sealing material, 15 first resin case, 16 first resin case, 17 insulating adhesive, 100 power supply, 200 power converter, 201 main conversion circuit, 202 semiconductor device, 203 drive circuit, 204 control circuit, 300 load, 400 moving vehicle.

The invention claimed is:

1. A semiconductor device comprising:
a base plate;
an insulating substrate disposed over the base plate;
a semiconductor chip disposed over the insulating substrate;
a first resin case and a second resin case attached to the base plate to enclose the insulating substrate and the semiconductor chip, and fitted together; and
a sealing material to seal the insulating substrate and the semiconductor chip, wherein
the first resin case and the second resin case are formed of resin materials having different comparative tracking indices,
an entirety of the first resin case is spaced from the base plate by way of the second resin case, and
the first resin case and the second resin case are fitted by a recess and protrusion structure such that the first resin case includes a first protrusion that protrudes in a vertical direction such that the first protrusion overlaps a first recess in the second resin case in the vertical direction.

2. The semiconductor device according to claim 1, wherein
the sealing material fills at least a portion of the recess and protrusion structure.

3. The semiconductor device according to claim 1, further comprising
an electrode terminal disposed over the insulating substrate, wherein
the electrode terminal is secured to one of the first resin case and the second resin case, and a creepage distance and clearance required for surface insulation of at least one of the first resin case and the second resin case are satisfied only by the one of the first resin case and the second resin case to which the electrode terminal is secured.

4. The semiconductor device according to claim 3, wherein the one of the first resin case and the second resin case to which the electrode terminal is secured includes a predetermined first part including a position where the electrode terminal is secured and a second part other than the first part, and the first part and the second part are formed of different resin materials.

5. The semiconductor device according to claim 3, wherein the electrode terminal is secured to the one of the first resin case and the second resin case by insert molding.

6. The semiconductor device according to claim 3, wherein the insulating substrate and the electrode terminal are ultrasonically bonded.

7. The semiconductor device according to claim 1, wherein the first resin case and the second resin case are secured with an insulating adhesive.

8. The semiconductor device according to claim 1, wherein the first resin case and the second resin case are formed of resin materials having a glass transition temperature of 100° C. or more.

9. The semiconductor device according to claim 8, further comprising an electrode terminal disposed over the insulating substrate, wherein the insulating substrate and the electrode terminal are ultrasonically bonded.

10. The semiconductor device according to claim 1, wherein the first resin case and the second resin case are fitted in a snap-fit.

11. The semiconductor device according to claim 1, wherein the first resin case and the second resin case are formed by two-color molding.

12. The semiconductor device according to claim 1, wherein the semiconductor chip is formed of a wide bandgap semiconductor.

13. The semiconductor device according to claim 1, wherein the first resin case has a higher comparative tracking index than that of the second resin case.

14. The semiconductor device according to claim 1, wherein the sealing material fills at least a portion of the recess and protrusion structure directly between the first protrusion and the first recess.

15. The semiconductor device according to claim 1, wherein the second resin case includes a second protrusion that protrudes in the vertical direction such that the second protrusion overlaps a second recess in the first resin case in the vertical direction.

16. A power converter comprising:

a main conversion circuit to convert input power for output, the main conversion circuit including the semiconductor device according to claim 1;

a drive circuit to output, to the semiconductor device, a drive signal to drive the semiconductor device; and a control circuit to output, to the drive circuit, a control signal to control the drive circuit.

17. A moving vehicle comprising the power converter according to claim 16.

* * * * *